United States Patent
Barowski et al.

(10) Patent No.: US 10,169,519 B2
(45) Date of Patent: *Jan. 1, 2019

(54) AREA SHARING BETWEEN MULTIPLE LARGE BLOCK SYNTHESIS (LBS) BLOCKS

(71) Applicant: International Business Machines Corporation, Armonk, NY (US)

(72) Inventors: Harry Barowski, Boeblingen (DE); Harald D. Folberth, Boeblingen (DE); Joachim Keinert, Altdorf (DE); Sourav Saha, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/910,730

(22) Filed: Mar. 2, 2018

(65) Prior Publication Data

US 2018/0189439 A1    Jul. 5, 2018

Related U.S. Application Data

(63) Continuation of application No. 15/170,157, filed on Jun. 1, 2016, now Pat. No. 9,946,830.

(51) Int. Cl.
*G06F 17/50* (2006.01)

(52) U.S. Cl.
CPC ........ *G06F 17/5072* (2013.01); *G06F 17/505* (2013.01); *G06F 17/5077* (2013.01)

(58) Field of Classification Search
USPC .......................... 716/118, 119, 124, 125, 126
See application file for complete search history.

(56) References Cited

U.S. PATENT DOCUMENTS

| | | | | |
|---|---|---|---|---|
| 8,230,379 | B2 * | 7/2012 | Kobayashi | G06F 17/5081 716/126 |
| 8,516,407 | B1 * | 8/2013 | Wang | G06F 17/5081 430/30 |
| 9,251,306 | B2 | 2/2016 | Kim | |
| 9,633,790 | B1 * | 4/2017 | Kim | H01G 4/30 |
| 2004/0255258 | A1 * | 12/2004 | Li | G06F 17/5068 716/122 |
| 2011/0023000 | A1 * | 1/2011 | Dirks | G06F 17/5072 716/122 |
| 2012/0001271 | A1 * | 1/2012 | Chae | H01L 29/4238 257/401 |
| 2012/0054699 | A1 | 3/2012 | Cho | |

(Continued)

OTHER PUBLICATIONS

List of IBM Patents or Patent Applications Treated as Related. Filed Mar. 2, 2018. 2 pages.

(Continued)

*Primary Examiner* — Brian Ngo
(74) *Attorney, Agent, or Firm* — Stosch Sabo (57) ABSTRACT

Respective large block synthesis (LBS) blocks of an integrated circuit (IC) are overlapped along a corner of each respective LBS block to form an overlap area having an area less than respective areas of respective LBS blocks that are overlapped. A first portion of the overlap area is allocated to a first LBS block and configured to be used by the first LBS block, and a second portion of the overlap area is allocated to a second LBS block and configured to be used by the second LBS block.

17 Claims, 9 Drawing Sheets

(56) References Cited

U.S. PATENT DOCUMENTS

| | | | |
|---|---|---|---|
| 2013/0174103 A1* | 7/2013 | Shieh | H01L 21/823431 716/54 |
| 2016/0079280 A1* | 3/2016 | Kim | H01L 27/124 257/773 |
| 2017/0212969 A1 | 7/2017 | Barowski | |
| 2017/0212970 A1 | 7/2017 | Barowski | |
| 2017/0351798 A1 | 12/2017 | Barowski et al. | |

OTHER PUBLICATIONS

Adya, et al., "On Whitespace and Stability in Mixed-Size Placement and Physical Synthesis", ICCAD '03: Proceedings of the 2003 IEEE/ACM international conference on Computer-aided design. Nov. 2003. San Jose, CA, USA. 8 pages.

Barowski et al., "Layout of Large Block Synthesis Blocks in Integrated Circuits", U.S. Appl. No. 15/840,595, filed Dec. 14, 2017.

Barowski et al., "Layout of Large Block Synthesis Blocks in Integrated Circuits", U.S. Appl. No. 15/840,631, filed Dec. 14, 2017.

Sham, et al., "Block flipping and white space distribution for wirelength minimization", Integration, the VLSI Journal 42 (2009). 8 pages.

Li et al., "A Greedy Algorithm for Wire Length Optimization", 18th IEEE International Conference on Electronics, Circuits and Systems (ICECS), 2011. 4 pages.

* cited by examiner

AREA SHARING BETWEEN MULTIPLE LARGE BLOCK SYNTHESIS (LBS) BLOCKS

BACKGROUND

The present disclosure relates to integrated circuit (IC) design, and, more specifically, to large block synthesis and structured synthesis design.

Traditional development of IC design in central processing units (CPU) comprises bottom-level blocks containing 10,000 or fewer cells. In contrast, large block synthesis (LBS) blocks can comprise LBS blocks containing 20,000 to 500,000 cells. Thus, LBS blocks can have higher performance than traditional blocks used in IC design.

SUMMARY

Aspects of the present disclosure relate to a method comprising receiving an integrated circuit (IC) floorplan comprising a plurality of large block synthesis (LBS) blocks, where respective LBS blocks comprise respective pluralities of macros merged therein. The method can further comprise selecting at least a first LBS block and at least a second LBS block of the plurality of LBS blocks, where the first LBS block shares at least a portion of a perimeter of the first LBS block with at least a portion of a perimeter of the second LBS block, where the first LBS block comprises a first length and a first width, and where the second LBS block comprises a second length and a second width. The method can further comprise overlapping a portion of the first LBS block with a portion of the second LBS block to form an overlap area comprising an overlap area width and an overlap area length, where the overlap area length is less than the first length and less than the second length, and where the overlap area width is less than the first width and less than the second width. The method can further comprise apportioning a first portion of the overlap area to the first LBS block and a second portion of the overlap area to the second LBS block, where apportioning a respective portion to a respective LBS block dedicates resources of the respective portion to the respective LBS block.

Further aspects of the present disclosure relate to an integrated circuit comprising a plurality of large block synthesis (LBS) blocks comprising respective pluralities of macros merged therein and including a first LBS block having a first width and a first length and a second LBS block having a second width and a second length, where respective LBS blocks comprise internal interconnects configured for communication within a respective LBS block and external interconnects configured for communication between respective LBS blocks. In some embodiments, the first LBS block and the second LBS block are overlapped to form an overlap area comprising an overlap width less than the first width and less than the second width and further comprising an overlap length less than the first length and less than the second length. In some embodiments, the overlap area is apportioned such that a first portion of the overlap area is utilized by the first LBS block and a second portion of the overlap area is utilized by the second LBS block.

Further aspects of the present disclosure relate to a computer program product comprising a computer readable storage medium having program instructions embodied therewith, where the computer readable storage medium is not a transitory signal per se, and where the program instructions are executable by a processor to cause the processor to perform a method comprising selecting, based on an integrated circuit (IC) floorplan, a first LBS block and a second LBS block of a plurality of LBS blocks containing respective pluralities of merged macros therein, where the first LBS block comprises a first length and a first width, and where the second LBS block comprises a second length and a second width. The program instructions can cause the processor to perform a method further comprising overlapping a portion of the first LBS block with a portion of the second LBS block to form an overlap area comprising an overlap width and an overlap length, where the overlap length is less than the first length and less than the second length, and where the overlap width is less than the first width and less than the second width. The program instructions can cause the processor to perform a method further comprising allocating a first portion of the overlap area to the first LBS block and a second portion of the overlap area to the second LBS block, where allocating a respective portion to a respective LBS block dedicates resources of the respective portion to the respective LBS block. The program instructions can cause the processor to perform a method further comprising storing a modified floorplan in the computer readable storage medium in response to allocating the first portion to the first LBS block and the second portion to the second LBS block.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to integrated circuit (IC) design, and, more specifically, to large block synthesis and structured synthesis design. During IC development, a schematic floorplan can be used to represent the placement of components of the IC such as, for example, large block synthesis (LBS) blocks. LBS blocks can comprise merged macros and flattened functional units to increase computational performance. As is understood by one of skill in the art, macros can refer to sub-components of an IC with a specified purpose. Merged macros can comprise a plurality of sub-components of the IC combined into a single component. Since multiple macros are merged within a single LBS block, there are fewer sub-components, and, therefore, the IC design hierarchy can be flattened.

Logic density on LBS blocks can be measured by utilization. Utilization can refer to the used area of a respective area (e.g., used to execute instructions, perform computations, etc.) divided by the respective area. Various LBS blocks can have various target utilizations. Peripheral regions of LBS blocks can have a lower utilization compared to central regions of LBS blocks. Thus, to increase utilization of peripheral regions, aspects of the present disclosure relate to overlapping respective corners of respective LBS blocks to increase utilization at the peripheries of the respective LBS blocks. According to some embodiments, corners of two or more blocks can be overlapped to form an overlap area. A first portion of the overlap area can be allocated to a first LBS block while a second portion of the overlap area can be allocated to a second LBS block. Allocated portions of the overlap area can be configured to be utilized by a respective LBS block.

Figure 1A:
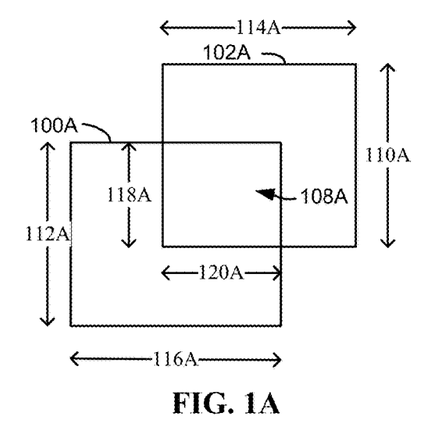
FIG. 1A illustrates an example overlap area of two LBS blocks in accordance with some embodiments of the present disclosure.

Referring now to the figures, FIG. 1A illustrates an example overlap area in accordance with some embodiments of the present disclosure. A first LBS block 100A can have a first width 112A and a first length 116A. A second LBS block 102A can have a second width 110A and a second length 114A. According to some embodiments of the present disclosure, the overlapping comprises overlapping respective corners of two respective blocks. The respective corners of the respective LBS blocks can be overlapped to create a rectangular or rectilinear overlap area 108A. Overlap area 108A can have an overlap width 118A and an overlap length 120A. Overlap width 118A can be less than first width 112A and less than second width 110A. Likewise, overlap length 120A can be less than first length 116A and second length 114A. In some embodiments, overlap area 108A comprises an area being less than or equal to 10% of an area of first LBS block 100A or second LBS block 102A. In some embodiments, overlap area 108A comprises an area less than 25% of an area of first LBS block 100A or second LBS block 102A. In some embodiments, overlap area 108A comprises an area less than 50% of an area of first LBS block 100A or second LBS block 102A. In some embodiments, overlap area 108A comprises an area less than 75% of an area of first LBS block 100A or second LBS block 102A. In some embodiments, overlap area 108A comprises an area less than an area of first LBS block 100A or second LBS block 102A.

Figure 1B:
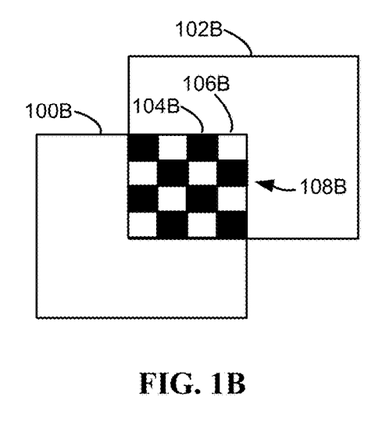
FIG. 1B illustrates an example equal overlap configuration of two LBS blocks in accordance with some embodiments of the present disclosure.

Referring now to FIG. 1B, illustrated is an example equal overlap configuration of two LBS blocks in accordance with some embodiments of the present disclosure. Aspects of the present disclosure relate to overlapping LBS blocks such as a first LBS block 100B and a second LBS block 102B to create an overlap area 108B. Respective portions of the overlap area 108B are associated with either the first LBS block 100B or the second LBS block 102B. A respective portion of overlap area 108B associated with a respective block results in resources associated with the respective portion being configured to be utilized by the respective block. For example, shaded portions 104B can be associated with the first LBS block 100B while unshaded portions 106B can be associated with the second LBS block 102B.

In various embodiments, the respective portions of the overlap area 108B corresponding to shaded portions 104B and unshaded portions 106B can comprise square portions, rectangular portions, and/or rectilinear portions of equal or varying size. In some embodiments, the overlap area 108B including shaded portions 104B and unshaded portions 106B are synthesized independently. As understood by one of skill in the art, synthesis of respective blocks can refer to placement and routing of electronic components, circuitry, logic, interconnects and other components necessary to realizing a portion of an IC design.

Figure 1C:
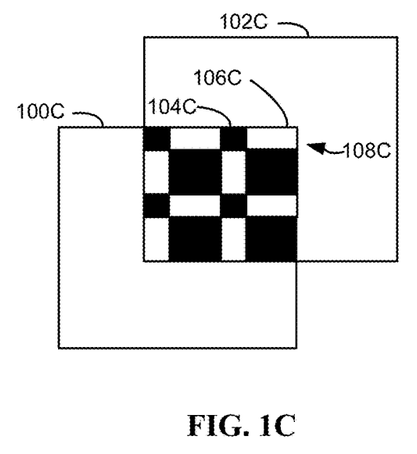
FIG. 1C illustrates an example non-equal overlap configuration of two LBS blocks in accordance with some embodiments of the present disclosure.

Referring now to FIG. 1C, illustrated is a block diagram of an example unequal overlap configuration in accordance with some embodiments of the present disclosure. For example, a first LBS block 100C can have an overlapping corner with a second LBS block 102C to form an overlap area 108C. Overlap area 108C can be apportioned between the two LBS blocks such that a shaded portion 104C can be configured to be utilized by the first LBS block 100C and an unshaded portion 106C can be configured to be utilized by the second LBS block 102C. As can be seen, shaded portion 104C comprises a larger cumulative area of the overlap area 108C than unshaded portion 106C. Thus, in some embodiments, the apportionment of overlap area 108C between first LBS block 100C and second LBS block 102C can be unequal. The unequal apportionment can be based on a ratio such as, for example, 1:2, 4:5, or other ratios. As can be further seen, shaded portion 104C comprises two respective geometries while unshaded portion 106C comprises a third respective geometry. Thus, the overlap area 108C can be segmented such that respective portions need not be equal in size or similar in geometry relative to other respective portions.

Figure 1D:
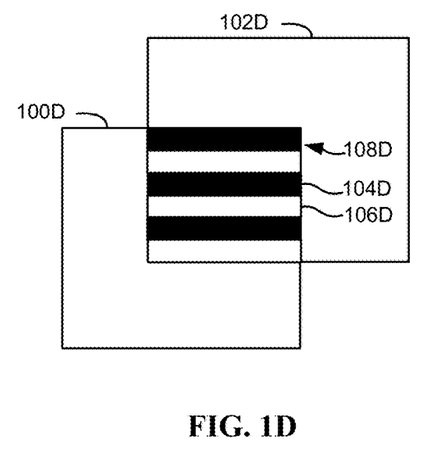
FIG. 1D illustrates another example overlap configuration of two LBS blocks in accordance with some embodiments of the present disclosure.

Referring now to FIG. 1D, illustrated is another example overlap configuration in accordance with some embodiments of the present disclosure. A first LBS block 100D can be overlapped with a second LBS block 102D to create an overlap area 108D. Respective portions of the overlap area 108D can be allocated to the first LBS block 100D and the second LBS block 102D. For example, shaded portions 104D can be configured to be utilized by first LBS block 100D and unshaded portions 106D can be configured to be utilized by second LBS block 102D. As can be seen, overlap area 108D is equally apportioned between the first LBS block 100D and the second LBS block 102D. Although the overlap configuration presented in both FIG. 1B and FIG. 1D comprise approximately equal apportionments, numerous variations of the apportionment pattern are possible as illustrated by the differences shown in overlap areas 108B and 108D of FIGS. 1B and 1D.

Thus, FIG. 1B through 1D illustrate example overlap configurations in accordance with some embodiments of the present disclosure. For generality, respective allocated portions can be referred to as respective rectilinear shapes herein. Respective overlap configurations can be referred to as interleaved rectilinear shapes herein. Respective interleaved rectilinear shapes can be realized according to placement and routing interconnects within respective LBS blocks and between respective LBS blocks as described hereinafter with respect to FIG. 2.

Figure 2:
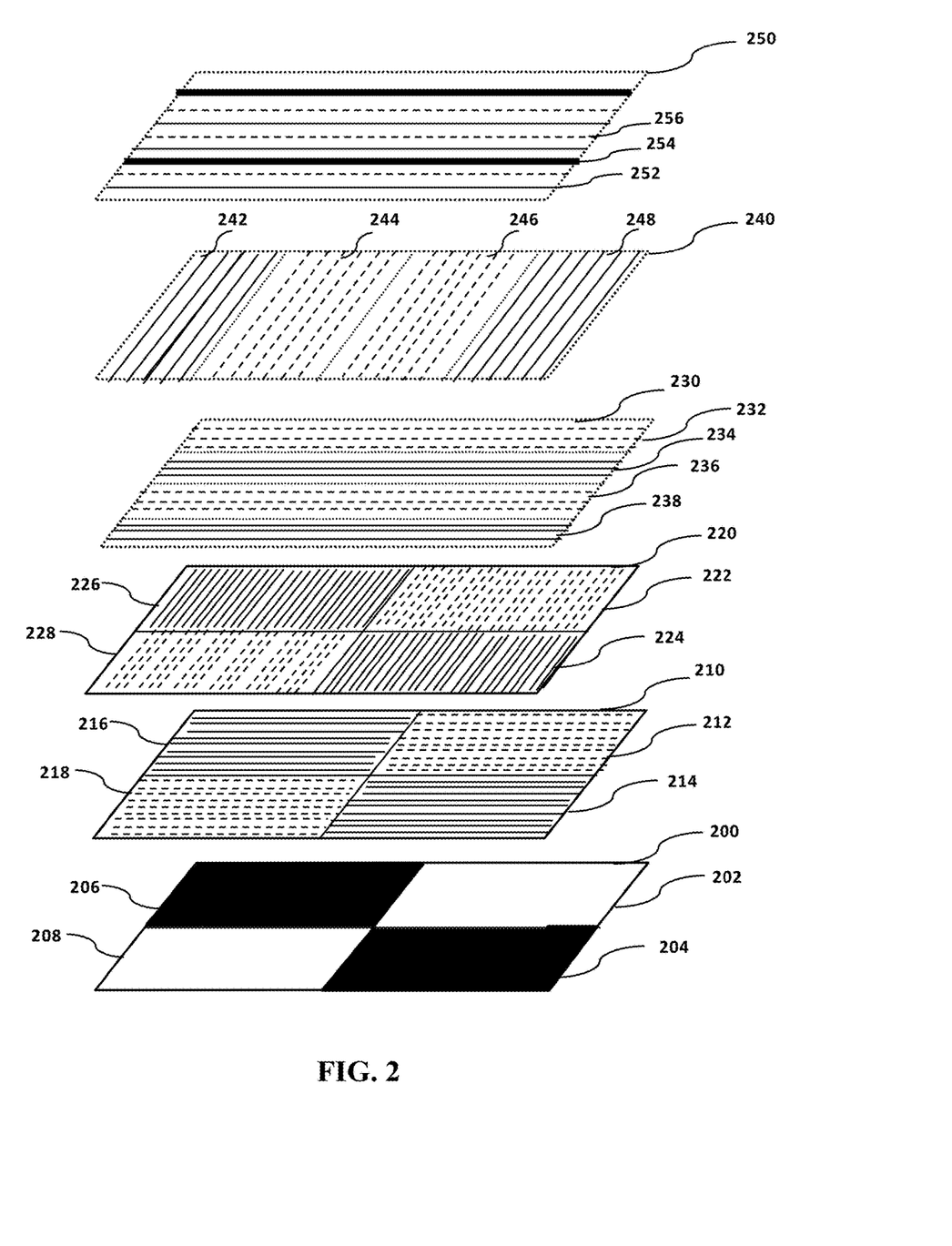
FIG. 2 illustrates an example routing diagram for an overlap area of two LBS blocks in accordance with some embodiments of the present disclosure.

Referring now to FIG. 2, illustrated is a fragment of routing in metallization layers placed above a fragment of an overlap area 200 such as, for example, overlap area 108B of FIG. 1B comprising interleaved rectilinear shapes 204 and 206 assigned to a first LBS block (e.g., shaded portion 104B allocated to first LBS block 100B) and interleaved rectilinear shapes 202 and 208 assigned to a second LBS block (e.g., unshaded portion 106B allocated to second LBS block 102B).

Layer 210 comprises internal interconnects oriented in a first direction and configured to facilitate processing within respective rectilinear shapes shown in the fragment of the overlap area 200. For example, internal interconnects 212 correspond to rectilinear shape 202, internal interconnects 214 correspond to rectilinear shape 204, internal interconnects 216 correspond to rectilinear shape 206, and internal interconnects 218 corresponds to rectilinear shape 208.

Layer 220 comprises internal interconnects oriented in a second direction and configured to facilitate processing within respective rectilinear shapes shown in the portion of the overlap area 200. For example, internal interconnects 222 can correspond to rectilinear shape 202, internal interconnects 224 can correspond to rectilinear shape 204, internal interconnects 226 can correspond to rectilinear shape 206, and internal interconnects 228 can correspond to rectilinear shape 208.

Internal interconnects can be oriented in more directions, fewer directions, and/or different directions than the directions shown and described with respect to layers 210 and 220. In some embodiments, a single layer of internal interconnects are used. In some embodiments, respective internal interconnects are multi-directional. Multi-directional interconnects can comprise non-overlapping interconnects exhibiting at least two directions within a respective rectilinear shape.

Layer 230 comprises horizontal interconnects between respective rectilinear shapes allocated to a same LBS block and horizontally associated. For example, interconnects 232 can connect rectilinear shape 202 to one or more respective rectilinear shapes in a same row as rectilinear shapes 206 and 202 and allocated to a same LBS block as rectilinear shape 202 (e.g., the second LBS block). Likewise, interconnects 238 can connect rectilinear shape 204 to one or more respective rectilinear shapes occurring in the same row as rectilinear shapes 204 and 208 and assigned to a same LBS block as rectilinear shape 204 (e.g., the first LBS block). Interconnects 236 can connect rectilinear shape 208 to one or more respective rectilinear shapes in the same row as rectilinear shapes 204 and 208 and allocated to a same LBS block as rectilinear shape 208 (e.g., the second LBS block). Interconnects 234 can connect rectilinear shape 206 to one or more respective rectilinear shapes in a same row as rectilinear shapes 206 and 202 and allocated to a same LBS block as rectilinear shape 206 (e.g., the first LBS block). In various embodiments, there can be more or fewer interconnects than the interconnects shown with respect to layer 230.

Layer 240 comprises vertical interconnects between respective rectilinear shapes allocated to a same LBS block. For example, interconnects 242 can connect rectilinear shape 206 to one or more respective rectilinear shapes in the same column as rectilinear shapes 206 and 208 and allocated to a same LBS block as rectilinear shape 206 (e.g., the first LBS block). Likewise, Interconnects 244 can connect rectilinear shape 208 to one or more respective rectilinear shapes in the same column as rectilinear shapes 206 and 208 and allocated to a same LBS block as rectilinear shape 208 (e.g., the second LBS block). Interconnects 246 can connect rectilinear shape 202 to one or more respective rectilinear shapes in a same column as rectilinear shapes 202 and 204 and allocated to a same LBS block as rectilinear shape 202 (e.g., the second LBS block). Interconnects 248 can connect rectilinear shape 204 to one or more respective rectilinear shapes in a same column as rectilinear shapes 202 and 204 and allocated to a same LBS block as rectilinear shape 204 (e.g., the first LBS block).

Thus, layers 230 and 240 exhibit interconnects connecting respective rectilinear shapes allocated to a same LBS block. In various embodiments, more or fewer interconnects in more layers or fewer layers can be used to connect similar or dissimilar rectilinear shapes than the rectilinear shapes shown and described with respect to layer 200 and the interconnects shown and described with respect to layers 230 and 240.

Layer 250 comprises interconnects 252 of the first LBS block, interconnects 256 of the second LBS block, and external interconnects 254. In some embodiments, external interconnects are associated with auxiliary cells. Auxiliary cells can be, for example, latches, buffers, and/or stages used to facilitate communication between respective LBS blocks or improve performance of respective LBS blocks. Auxiliary cells are described in more detail hereinafter with respect to FIG. 3.

Figure 3:
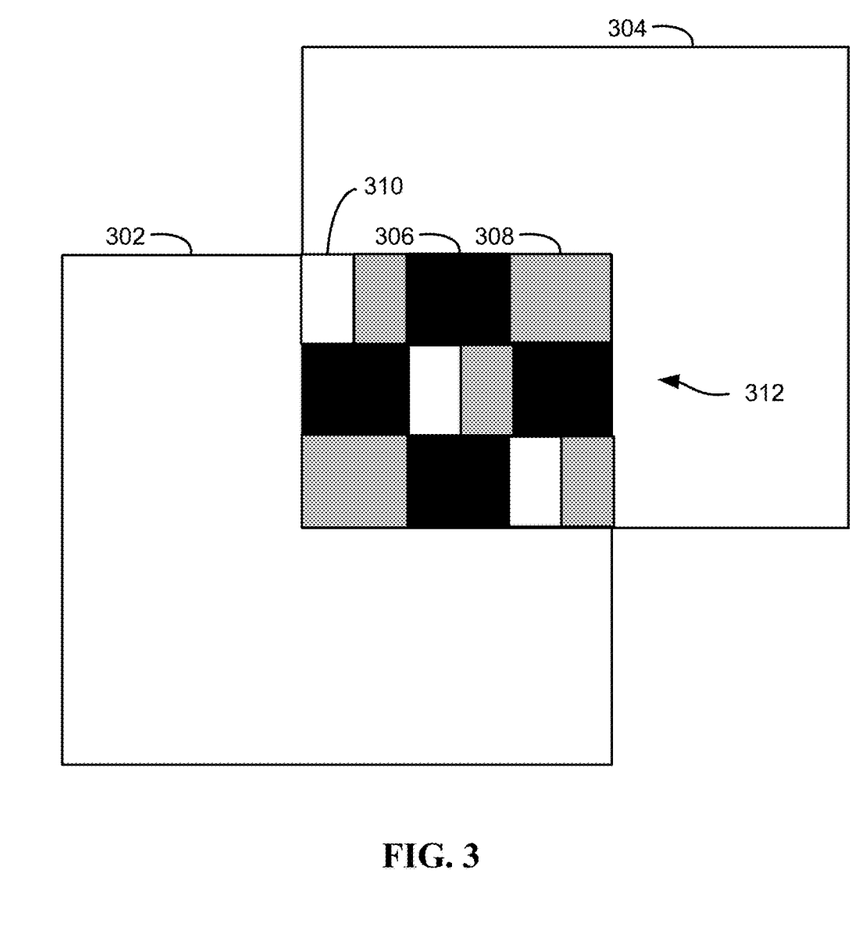
FIG. 3 illustrates an example auxiliary overlap configuration of two LBS blocks in accordance with some embodiments of the present disclosure.

Referring now to FIG. 3, illustrated is a block diagram of an overlap configuration having one or more auxiliary cells in accordance with some embodiments of the present disclosure. The overlap configuration can contain an overlap area 312 between a first LBS block 302 and a second LBS block 304. The overlap area 312 can be partitioned into first fully shaded portions 306 configured to be utilized by the first LBS block 302, second partially shaded portions 308 configured to be utilized by the second LBS block 304, and third unshaded portions 310 configured to be used as one or more auxiliary cells. References to unshaded, partially shaded, and shaded portions are for descriptive purposes of the drawings only and are not meant to reflect physical characteristics of embodiments of the present disclosure. In some embodiments, auxiliary cells refer to portions of the overlap area 312 configured to be used for stages, buffers, and/or latches. As is understood by one of skill in the art, stages, buffers, and/or latches can be used individually or in combination to facilitate communication within respective LBS blocks, between respective LBS blocks, or to otherwise improve performance of respective LBS blocks. In some embodiments, auxiliary cells located within the overlap area 312 can improve signal propagation in the external interconnects connecting the LBS blocks (e.g., external interconnects 254 of FIG. 2).

Respective portions of the overlap area 312 can be similar or dissimilar in size and/or geometry relative to other portions of the overlap area 312. In various embodiments, there are more portions or fewer portions than the portions shown. Respective geometries of respective portions can be synthesized by placement and routing of interconnects in one or more layers such as the interconnects and layers shown and described with respect to FIG. 2.

Figure 4:
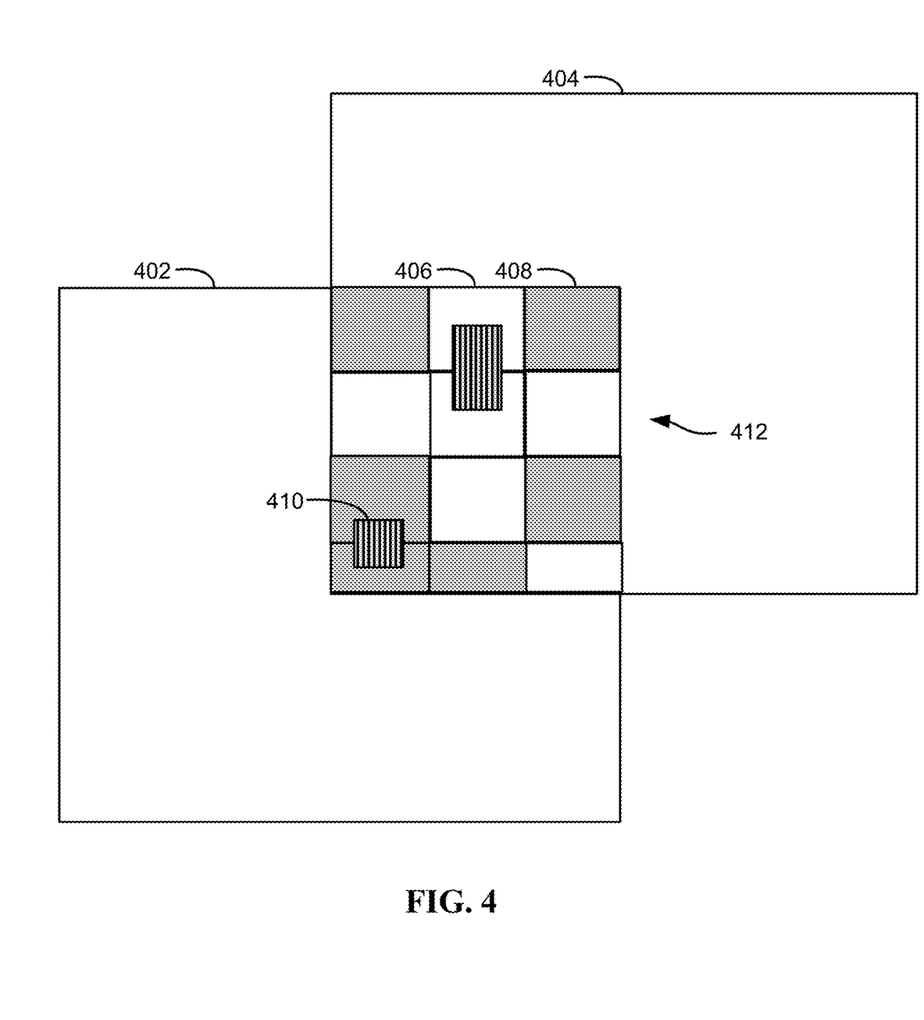
FIG. 4 illustrates an example block overlap configuration of two LBS blocks in accordance with some embodiments of the present disclosure.

Referring now to FIG. 4, illustrated is a block diagram of an overlap configuration having one or more proprietary (IP) blocks placed therein in accordance with some embodiments of the present disclosure. The overlap configuration can contain an overlap area 412 between a first LBS block 402 and a second LBS block 404. The overlap area 412 can comprise first unshaded portions 406 configured to be utilized by the first LBS block 402. The overlap area 412 can comprise second shaded portions 408 configured to be utilized by the second LBS block 404. The overlap area 412 can comprise respective striped areas 410 located within either the first unshaded portions 406 or the second shaded portions 408. The terms unshaded, partially shaded are used herein for purposes of describing the example drawings only and are not meant to describe physical characteristics of respective areas of the IC. The respective striped areas 410 can comprise proprietary (IP) blocks (e.g., IP core) with fixed placement. As is understood by one of skill in the art, IP blocks can refer to a reusable unit (e.g., logic, cell, chip layout) that is the intellectual property of one party and can be integrated into an IC as a subcomponent of the IC. In some embodiments, IP blocks can be located in two or more adjacent portions allocated to a same LBS block. Thus, IP blocks are not required to be located in a single, respective portion of an overlap area allocated to a respective LBS block. Rather, in accordance with some embodiments of the present disclosure, respective IP blocks can be located in a plurality of contiguous portions allocated to a same LBS block and situated adjacent to one another.

Figure 5:
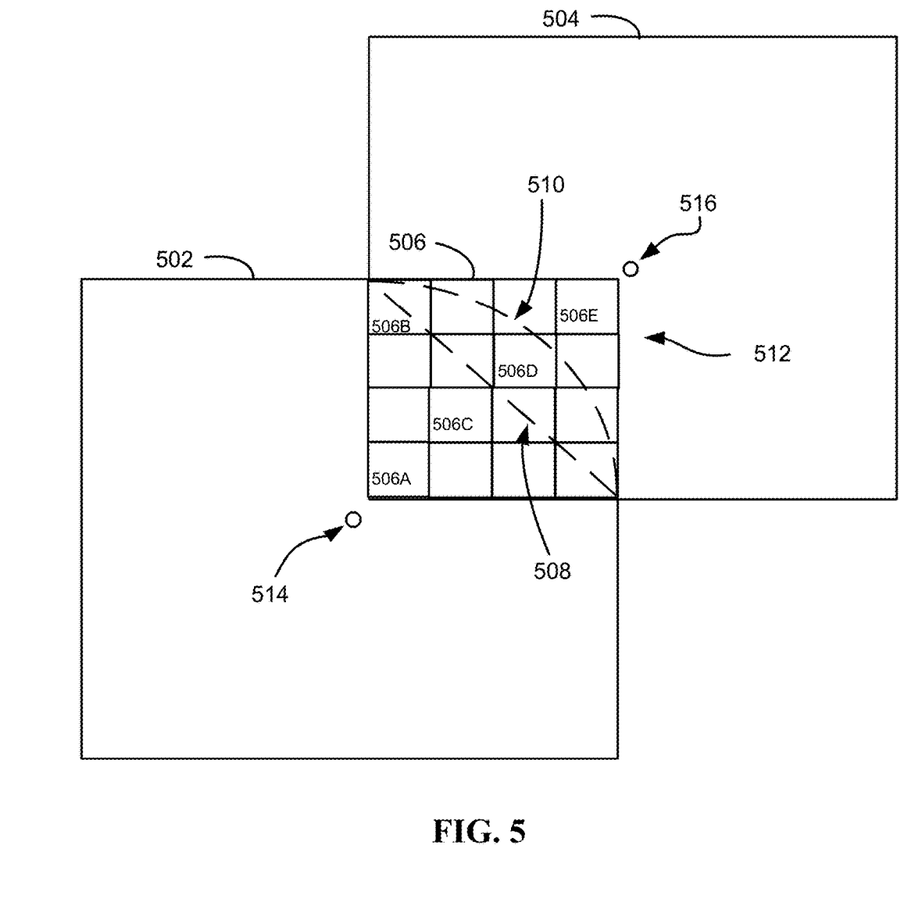
FIG. 5 illustrates an example gradient overlap configuration of two LBS blocks in accordance with some embodiments of the present disclosure.

Referring now to FIG. 5, illustrated is a block diagram of an example gradient overlap configuration in accordance with some embodiments of the present disclosure. The gradient overlap configuration can comprise a corner of a first LBS block 502 overlapping a corner of a second LBS block 504 to form an overlap area 512. The overlap area 512 can be segmented into a plurality of sectors 506 (also referred to as sub-blocks herein). One or more logic density gradients such as linear density gradient 508 and parabolic density gradient 510 can be defined. The logic density gradients can be linear, step-wise, parabolic, rectilinear, or other geometries corresponding to other functions or combinations of functions. The plurality of sectors 506 can be configured to be utilized by either the first LBS block 502 or the second LBS block 504 according to a logic density gradient. For example, a respective sector 506A located in the bottom left corner of the overlap area 512 can be configured to be utilized by the first LBS block 502 based on the position of the respective sector 506A relative to linear density gradient 508. In contrast, a respective sector 506B located in the upper left portion of the overlap area 512 can be configured to be approximately equally apportioned between the first LBS block 502 and the second LBS block 504 based on the linear density gradient 508 bisecting the respective sector 506B located in the upper left corner of the overlap area 512.

In alternative embodiments, the allocation of respective portions of respective sectors 506 (also referred to as sub-portions herein) in the overlap area 512 can be a function of the distance from a point in a respective sector 506 to the center of a respective LBS block such as a first center 514 corresponding to the first LBS block 502 and a second center 516 corresponding to the second LBS block 504. For example, a respective sector 506A located in the bottom left corner of overlap area 512 can be 100% apportioned to first LBS block 502 due to the proximate position of respective sector 506A relative to the first center 514 corresponding to the first LBS block 502. In such an example, respective sector 506C can be approximately 75% apportioned to the first LBS block 502, respective sector 506D can be approximately 25% apportioned to the first LBS block 502, and respective sector 506E can be approximately 0% apportioned to the first LBS block 502. In such an example, respective apportionments of respective sectors 506 to the second LBS block 504 can be the inverse of the respective apportionments of respective sectors to the first LBS block 502 (where the inverse is understood to mean a remaining proportion of a respective sector following apportionment to the first LBS block 502 such that a sum of a first sub-portion allocated to first LBS block 502 and a second sub-portion allocated to a second LBS block 504 equals 100%). For example, approximately 100% of sector 506E can be apportioned to the second LBS block 504 as a result of the proximate position of sector 506E to the second center 516 corresponding to second LBS block 504, and further as a result of the remaining portion of the respective sector 506E which has not been apportioned to the first LBS block 502. Likewise, respective sector 506D can be approximately 75% apportioned to the second LBS block 504, respective sector 506C can be approximately 25% apportioned to the second LBS block 504, and respective sector 506A can be approximately 0% apportioned to the second LBS block 504.

It is to be understood that the aforementioned example is non-limiting and additional examples of increased complexity fall within the spirit and scope of the present disclosure. Furthermore, apportionments of respective sectors 506 can be made as a result of other variables different from, or in addition to, proximity to respective centers of respective LBS blocks.

Figure 6A:
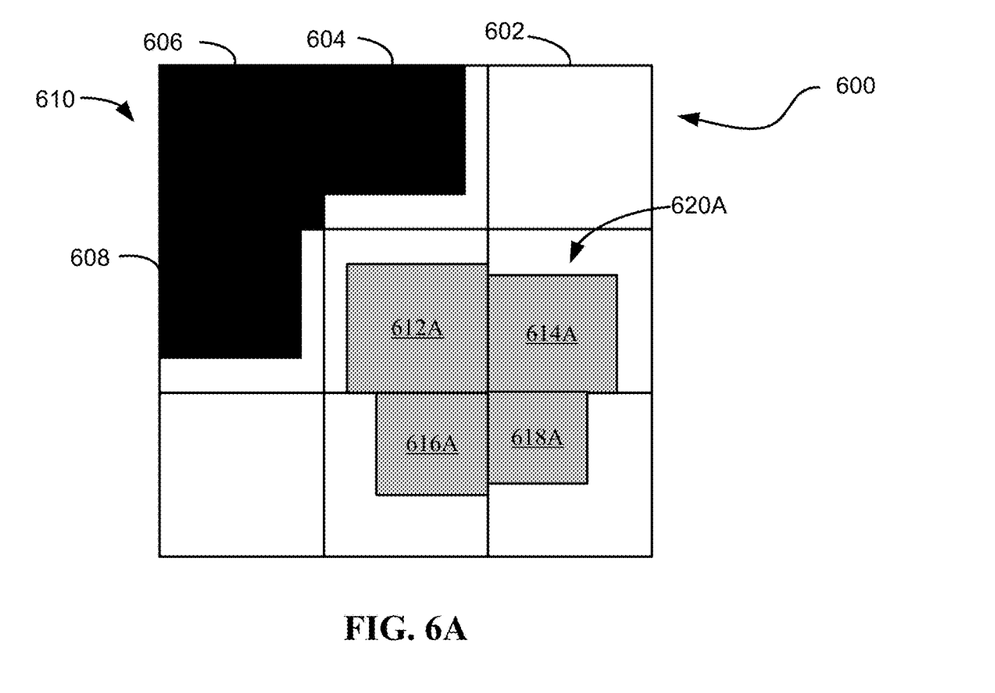
FIG. 6A illustrates an example of clustering in an overlap configuration of two LBS blocks in accordance with some embodiments of the present disclosure.

Referring now to FIG. 6A, illustrated is a block diagram of clustering respective portions of respective sectors of an overlap area between two or more respective LBS blocks in accordance with some embodiments of the present disclosure. In some embodiments, overlap areas can be clustered to reduce fragmentation. In such embodiments, portions of the overlap area can be grouped together to centralize logic in a cluster of respective portions of respective sectors of an overlap area being apportioned to a same LBS block.

For example, a portion of an overlap area 600 can comprise a plurality of sectors 602. Respective portions of respective sectors 602 can be configured to be utilized by a respective LBS block such as a first LBS block and a second LBS block. Apportionment of respective sectors 602 to the first LBS block or the second LBS block can be based on, for example, a logic density gradient. Respective apportionments to the first LBS block can be identified by partially shaded portions such as partially shaded portions 612A, 614A, 616A, and 618A. Respective apportionments to the second LBS block can be identified by fully shaded portions such as fully shaded portions 604, 606, and 608. The terms shaded and partially shaded are for descriptive purposes of the drawings only and are not meant to reflect physical characteristics of embodiments of the present disclosure.

Respective portions 604, 606, and 608 can be clustered in an upper left portion of the overlap area 600 to generate contiguous clustered area 610 configured to be utilized by the second LBS block. Likewise, respective portions 612A, 614A, 616A, and 618A can be configured to be utilized by a first LBS block and can be clustered together to create contiguous clustered area 620A. Respective portions of respective sectors 602 can be clustered according to one or more algorithms configured to, for example, produce a contiguous area above a threshold contiguous area for a respective cluster. Respective threshold contiguous areas can be constant or can be a function of, for example, a distance of respective sectors to a center of a respective block or as a function of the logic density gradient defining respective portions of respective sectors to be utilized by either the first LBS block or the second LBS block.

Figure 6B:
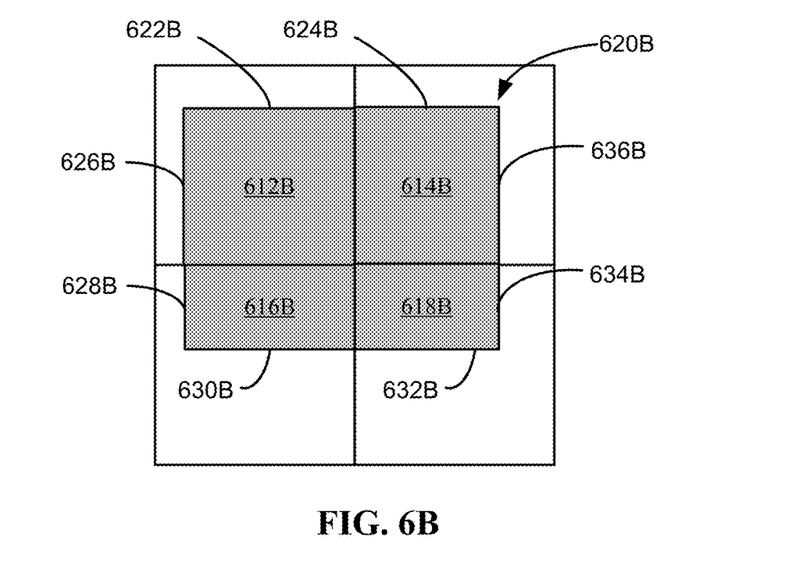
FIG. 6B illustrates an example of block alignment in a clustered overlap configuration in accordance with some embodiments of the present disclosure.

Referring now to FIG. 6B, illustrated is a block diagram of an example modified contiguous clustered area in accordance with some embodiments of the present disclosure. In some embodiments, the modified contiguous clustered area 620B is a modification of clustered area 620A illustrated in FIG. 6A. In some embodiments, cluster edges can be aligned and portion geometries re-sized. For example, portion 612B can be modified relative to portion 612A such that the area of portion 612B remains substantially the same as an area of portion 612A while edge 622B becomes approximately collinear with edge 624B of portion 614B and where edge 626B becomes approximately collinear with edge 628B of portion 616B. In addition to the aforementioned modifications, the dimensions of portion 614B can be modified to maintain a substantially constant area of 614B while making edge 636B approximately collinear with edge 634B of portion 618B. In further addition to the aforementioned modifications, the dimensions of portion 618B can be modified to maintain a constant area of portion 618B while making edge 632B approximately collinear to edge 630B of portion 616B. Thus, contiguous clustered area 620B can have approximately the same area as contiguous clustered area 620A, however, contiguous clustered area 620B can comprise an approximately rectangular geometry.

Figure 7:
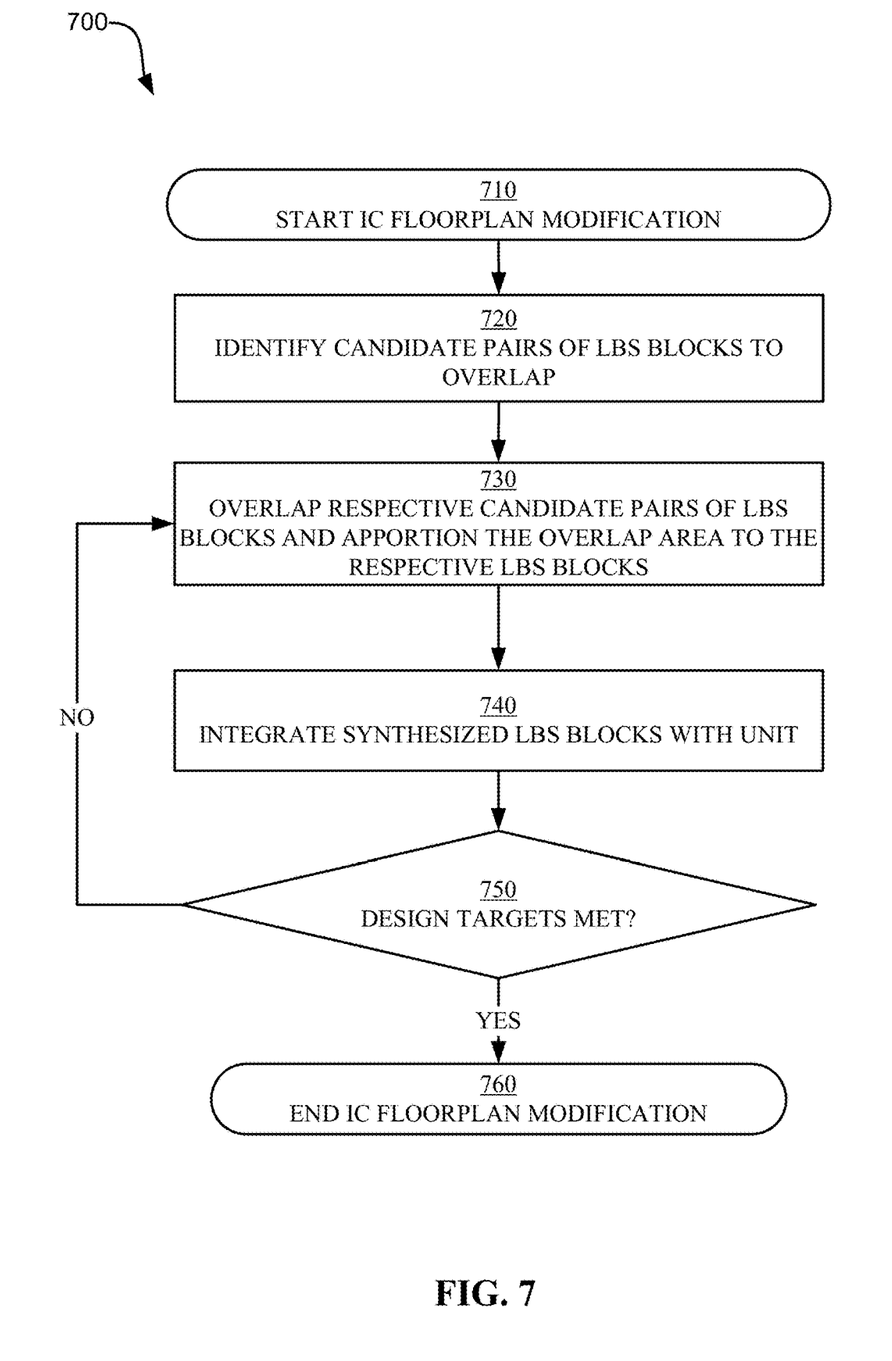
FIG. 7 illustrates a flowchart for an example method for overlapping respective pairs of LBS blocks in accordance with some embodiments of the present disclosure.

Referring now to FIG. 7, illustrated is a flowchart for an example method for integrating overlapped LBS blocks into an IC floorplan in accordance with some embodiments of the present disclosure. In some embodiments, the method 700 can be executed by one or more processors as part of a computer system described hereinafter with respect to FIG. 9.

The method 700 can begin at operation 710 by a processor receiving an IC floorplan containing two or more LBS blocks therein. In operation 720, the processor identifies a candidate pair of LBS blocks. Candidate pairs of LBS blocks can be identified by the respective LBS blocks having at least a portion of a perimeter in common. At least a portion of a perimeter in common is to be understood to include any single point in common. Candidate pairs of LBS blocks can be further identified based on utilization relative to a target utilization. Thus, a LBS block can have at least a portion of the LBS block (e.g., a periphery of the LBS block) having a utilization below a target utilization. For example, a periphery of an LBS block can have a utilization of 30% whereas a target utilization for the LBS block can be 80%. Thus, respective LBS blocks sharing at least a portion of at least one edge and having at least a portion of each respective LBS block proximate to the shared edge below a target utilization can be further identified as a candidate pair. In some embodiments, the ratio of the utilization of the area proximate to the shared edge by the target utilization can be used to determine a candidate pair. For example, a portion of an LBS block proximate to a shared edge with a second LBS block having a utilization less than 50% of the target utilization can be considered a candidate pair for overlapping.

In further embodiments, communication between two LBS blocks can be used to determine candidacy of respective LBS blocks having at least a portion of at least one edge in common. Communication can be measured by a percentage of pins connecting a first LBS block to a second LBS block where the first LBS block and the second LBS block share at least a portion of a perimeter in common. In some embodiments, two respective LBS blocks each having at least 20% of pins of the one LBS block connecting to the other LBS block can be determined to be a candidate pair of LBS blocks.

In operation 730, the processor can generate an updated floorplan where the updated floorplan contains at least two LBS blocks having overlapping corners. The overlapping corners can form an overlap area. The overlap area can comprise a rectangular or rectilinear geometry. In cases where the overlap area comprises a rectangular geometry, the overlap area can comprise an overlap width and an overlap length. The overlap width can be less than a width of the first LBS block and a width of the second LBS block. The overlap length can be less than a length of the first LBS block and a length of the second LBS block, as discussed above.

In operation 730 the processor can further apportion the overlap area between the first LBS block and the second LBS block. Apportioning (also referred to as allocating herein) can comprise configuring respective portions of the overlap area to be utilized by either the first LBS block or the second LBS block. The apportioning can include overlapping configurations such as, but not limited to, the overlapping configurations shown and described with respect to FIGS. 1B-1D and 3-6. The apportioning can be realized via placement and routing of interconnects and other components such as shown and described with respect to FIG. 2. Operation 730 is described in further detail hereinafter with respect to FIG. 8.

In operation 740, the processor can integrate the synthesized LBS blocks into a next level of the IC floorplan (e.g., the unit corresponding to the IC floorplan) as understood by one of skill in the art. Operation 750 can determine if the design targets (e.g., utilization, efficiency, or other design targets applicable to an IC or portion thereof) for the next level of the IC floorplan have been met. In the event the design targets have not been met, the processor can overlap different LBS blocks, or re-apportion respective overlap areas of respective LBS blocks in operation 730 to achieve the design targets. Thus, the processor repeats operations 730-750 until the design targets have been met. In the event the processor determines that the design targets have been met in operation 750, the processor ends the IC floorplan modification in operation 760. In some embodiments, operation 760 can comprise storing the floorplan modification in a computer readable storage medium. In some embodiments, operation 760 can comprise outputting the modified floorplan to a display.

Figure 8:
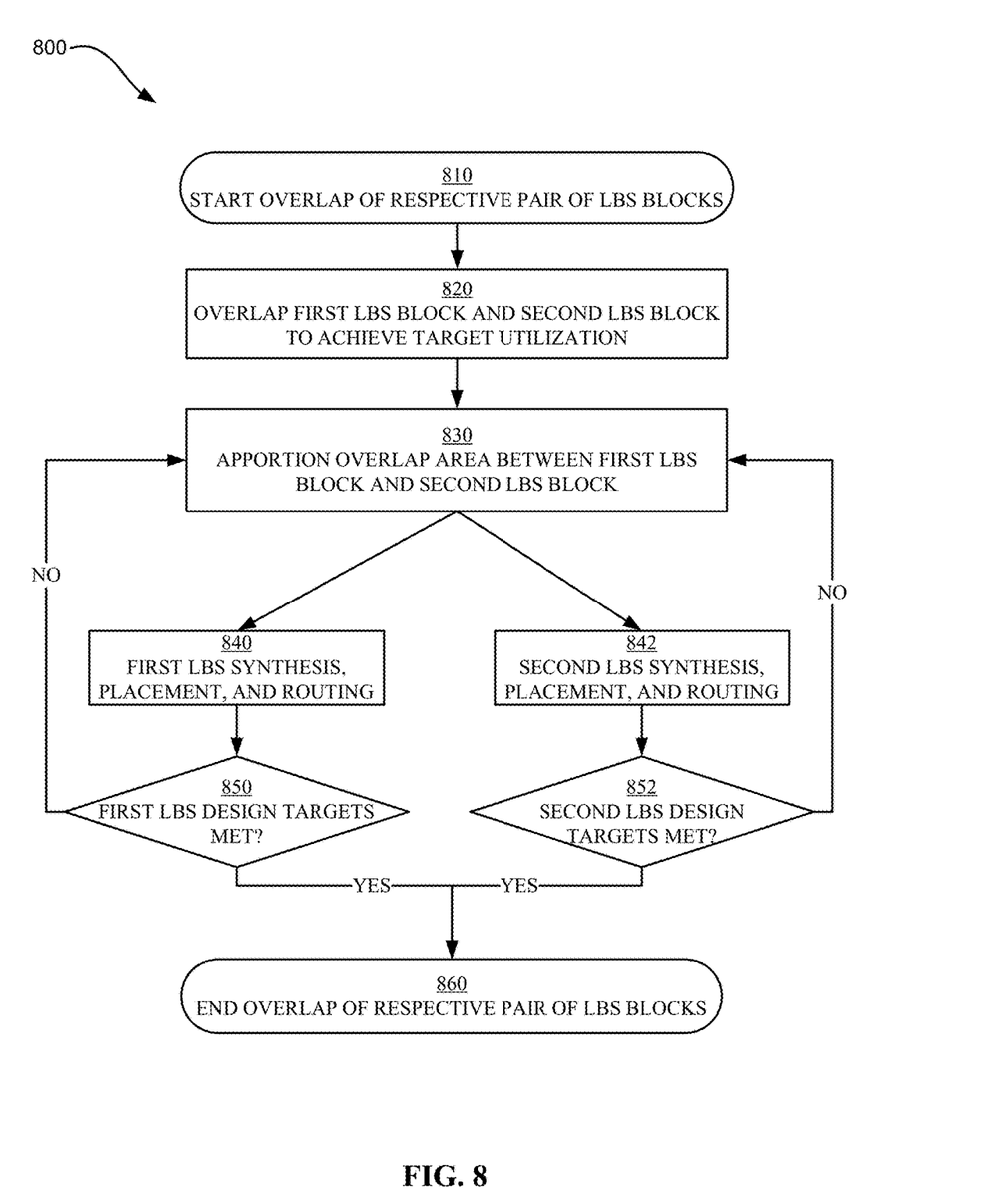
FIG. 8 illustrates a flowchart for an example method for apportioning an overlap area in accordance with some embodiments of the present disclosure.

Referring now to FIG. 8, illustrated is a flowchart of an example method for overlapping a respective candidate pair of LBS blocks in accordance with some embodiments of the present disclosure. In some embodiments, the method 800 is a sub-method of operation 730 of FIG. 7. In some embodiments, the method 800 can be executed by one or more processors as part of a computer system as described hereinafter with respect to FIG. 9.

The method 800 can begin at operation 810 where a processor selects a respective candidate pair of LBS blocks such as a respective candidate pair of LBS blocks identified in operation 720 of FIG. 7. In operation 820, the processor overlaps a first corner of a first LBS block with a second corner of a second LBS block. Respective corners can be overlapped so that an overlap area is formed. The overlap area can comprise a length and a width. The length of the overlap area can be less than a length of the first LBS block and less than a length of the second LBS block, as discussed above. The width of the overlap area can be less than a width of the first LBS block and less than a width of the second LBS block, as discussed above. For example, in some embodiments, the overlap area comprises an area less than 10%, 25%, 50%, or 75% of an area of the first LBS block or an area of the second LBS block. In some embodiments, the overlap area comprises an area less than an area of the first LBS block or an area of the second LBS block.

In operation 830, the processor apportions the overlap area between the first LBS block and the second LBS block. The apportioning can comprise numerous patterns such as those described with respect to FIGS. 1B-1D and 3-6. Respective apportioned areas can be clustered to form contiguous clustered areas according to some embodiments. Respective contiguous clustered areas can be modified such that the modified contiguous clustered areas can comprise rectangular geometries according to some embodiments.

In operation 840, the processor synthesizes, places, and routes the first LBS block. In operation 842, the processor synthesizes, places, and routes the second LBS block. In some embodiments, operations 840 and 842 can occur in parallel with one another. Synthesis, placement, and routing can comprise defining interconnects for respective LBS blocks. In some embodiments, Operations 840 and 842 define interconnects as shown and described with respect to FIG. 2.

In operation 850, the processor determines if the design targets for the first LBS block have been met. In operation 852, the processor determines if the design targets for the second LBS block have been met. The design targets can comprise, for example, a utilization of the overlapping area compared to a target utilization. In some embodiments, operation 850 and operation 852 can occur in parallel. In the event the processor determines that the design targets have not been met in operations 850 or 852, then the processor returns to operation 830 and modifies the apportionment of the overlap area between the first LBS block and the second LBS block and proceeds again through operations 840-852.

In the event the processor determines the design targets have been met in both operation 850 and 852, then the processor ends the overlapping of the respective pair of candidate LBS blocks in operation 860. In some embodiments, the processor stores the data generated by the method 800 in a computer readable storage medium or outputs the data generated by the method 800 to a user interface as a part of operation 860. The data can be, for example, one or more of an updated floorplan corresponding to the overlap configuration of the candidate pair of LBS blocks, the determination that the design targets were met, a measure of respective performance characteristics of the respective LBS blocks (e.g., utilization), respective iterations of the apportionment of the overlap area between the candidate pair of LBS blocks, and/or other data relevant to the design, manufacture, testing, and/or use of the overlapped LBS blocks, the IC floorplan, and/or the unit in which the aforementioned are integrated. In some embodiments, the method 800 is repeated sequentially or in parallel for a plurality of respective candidate pairs of LBS blocks.

Figure 9:
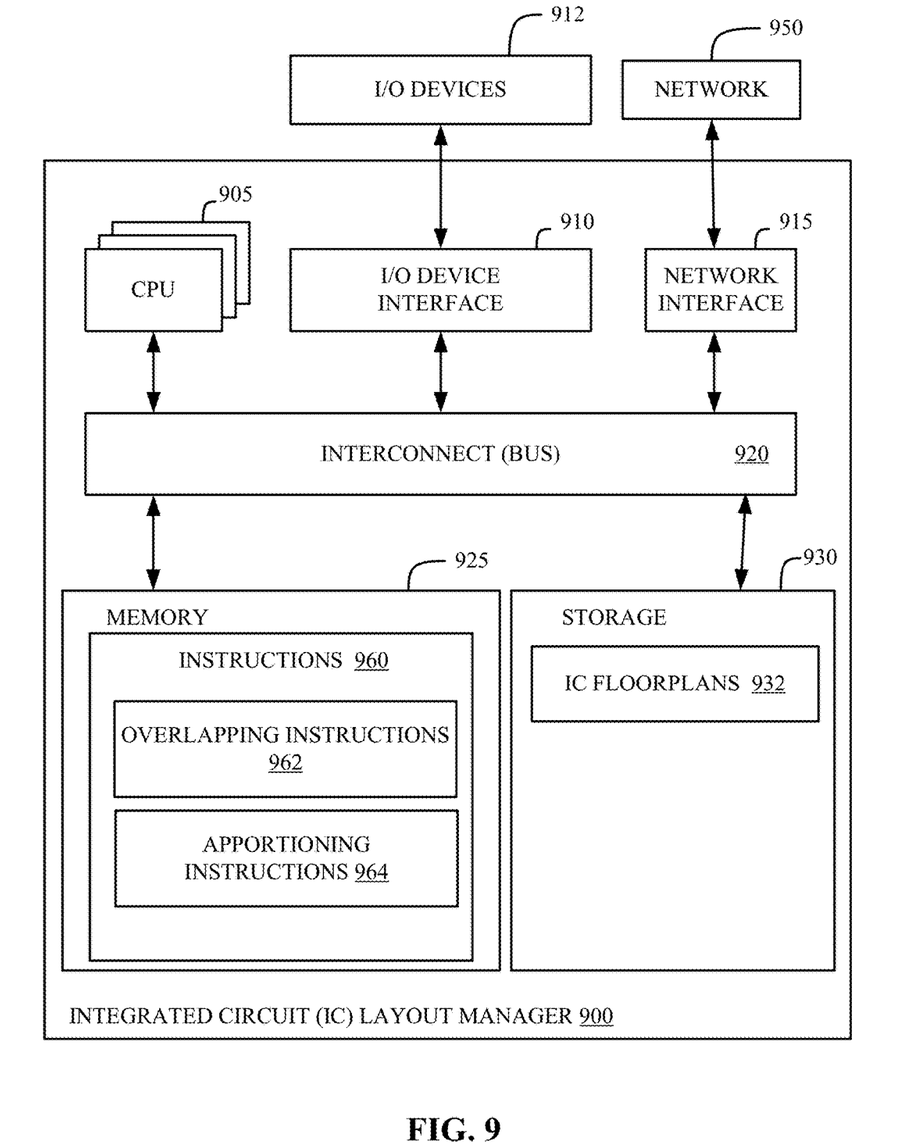
FIG. 9 illustrates a block diagram of an integrated circuit layout manager in accordance with some embodiments of the present disclosure.

Referring now to FIG. 9, illustrated is a block diagram of an integrated circuit (IC) layout manager in accordance with some embodiments of the present disclosure. The IC layout manager 900 can include a memory 925, storage 930, an interconnect (e.g., BUS) 920, one or more processors (e.g., CPUs) 905, an I/O device interface 910, I/O devices 912, and a network interface 915. The IC layout manager 900 can be configured to execute methods such as the methods shown and described with respect to FIG. 7-8. The IC layout manager 900 can be further configured to generate designs for overlap areas between two or more LBS blocks such as the overlap areas shown and described with respect to FIGS. 1B-1D and 3-6. The IC layout manager 900 can be further configured to generate interconnects (e.g., as shown and described with respect to FIG. 2), auxiliary cells, dummy fillers (e.g., to enable testing and/or sign-off for various components), placement blockages (e.g., to reduce congestion in the IC), and other items beneficial to successfully realizing the apportioned overlap areas shown and described with respect to FIGS. 1B-1D and 3-6.

Each CPU 905 retrieves and executes programming instructions stored in the memory 925 or storage 930. The interconnect 920 is used to move data, such as programming instructions, between the CPU 905, I/O device interface 910, storage 930, network interface 915, and memory 925. The interconnect 920 can be implemented using one or more busses. The CPUs 905 (also referred to as processors 905 herein) can be a single CPU, multiple CPUs, or a single CPU having multiple processing cores in various embodiments. In some embodiments, a processor 905 can be a digital signal processor (DSP). Memory 925 is generally included to be representative of a random access memory (e.g., static random access memory (SRAM), dynamic random access memory (DRAM), or Flash). The storage 930 is generally included to be representative of a non-volatile memory, such as a hard disk drive, solid state device (SSD), removable memory cards, optical storage, or flash memory devices. In an alternative embodiment, the storage 930 can be replaced by storage area-network (SAN) devices, the cloud, or other devices connected to the IC layout manager 900 via the I/O devices 912 or a communication network 950 via the network interface 915.

In some embodiments, the memory 925 stores instructions 960 and the storage 930 stores a one or more integrated circuit (IC) floorplans 932. However, in various embodiments, the instructions 960 and the IC floorplans 932 are stored partially in memory 925 and partially in storage 930, or they are stored entirely in memory 925 or entirely in storage 930, or they are accessed over a network 950 via the network interface 915.

The instructions 960 can store processor executable instructions for various methods such as the method shown and described with respect to FIG. 7-8. The instructions can include overlapping instructions 962 and apportioning instructions 964. Overlapping instructions 962 can store processor executable instructions configured to overlap two or more LBS blocks such that respective corners of the two or more LBS blocks are overlapping. Apportioning instructions 964 can include processor-executable instructions configured to generate at least a first portion of an overlapped area to be utilized by a first LBS block, and at least a second portion of an overlapped area to be utilized by a second LBS block. Apportioning instructions 964 can apportion overlapping areas according to any one, or any combination of, the configurations shown and described with respect to FIGS. 1B-1D and 3-6.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments of the present invention may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing, invoicing, or otherwise receiving payment for use of the systems.

What is claimed is:

1. A method comprising:
    receiving an integrated circuit (IC) floorplan comprising a plurality of large block synthesis (LBS) blocks, wherein respective LBS blocks comprise respective pluralities of macros merged therein;
    selecting at least a first LBS block and at least a second LBS block of the plurality of LBS blocks, wherein the first LBS block shares at least a portion of a perimeter of the first LBS block with at least a portion of a perimeter of the second LBS block, wherein the first LBS block comprises a first area, and wherein the second LBS block comprises a second area, wherein selecting at least the first LBS block and at least the second LBS block further comprises:
        determining a first utilization of a periphery of the first LBS block is below a target utilization and a second utilization of a periphery of the second LBS block is below the target utilization;
    overlapping a portion of the first LBS block with a portion of the second LBS block to form an overlap area, wherein the overlap area is less than the first area, wherein the overlap area is less than the second area;
    apportioning a first portion of the overlap area to the first LBS block and a second portion of the overlap area to the second LBS block, wherein apportioning a respective portion to a respective LBS block dedicates resources of the respective portion to the respective LBS block; and
    manufacturing an integrated circuit based on the IC floorplan and comprising the first portion of the overlap area apportioned to the first LBS block and the second portion of the overlap area apportioned to the second LBS block.

2. The method of claim 1, wherein the overlap area comprises an area of 75% or less of an area of the first LBS block.

3. The method of claim 1, wherein apportioning a first portion of the overlap area to the first LBS block and a second portion of the overlap area to the second LBS block further comprises:
    defining the first portion and the second portion according to an overlap configuration that defines the overlap area using a plurality of sub-blocks, wherein the first portion comprises a first set of sub-blocks or portions thereof, wherein the second portion comprises a second set of sub-blocks, or portions thereof.

4. The method of claim 3, further comprising:
    routing, according to the overlap configuration, a plurality of interconnects of the first LBS block, a plurality of interconnects of the second LBS block, and a plurality of external interconnects between the first LBS block and the second LBS block.

5. The method of claim 3, wherein respective sub-blocks of the overlap configuration are further apportioned such that respective first sub-portions of respective sub-blocks of the first set and second set of sub-blocks are apportioned to the first LBS block and respective second sub-portions of respective sub-blocks of the first set and second set of sub-blocks are apportioned to the second LBS block;
    wherein respective first sub-portions and respective second sub-portions are defined by a logic density function based on respective first distances from respective sub-blocks to a first center of the first LBS block and respective second distances from respective sub-blocks to a second center of the second LBS block; and
    wherein respective first sub-portions range from 0% to 100%, inclusive, and respective second sub-portions range from 0% to 100%, inclusive, and respective sums of respective first sub-portions and respective second sub-portions associated with a same respective sub-block equals 100%.

6. The method of claim 5, wherein at least two sub-portions of at least two adjacent sub-blocks allocated to a same LBS block are located along at least one shared edge of the at least two adjacent sub-blocks such that a contiguous area comprising two or more sub-portions allocated to a same LBS block is formed.

7. The method of claim 6, wherein at least two sub-portions placed along at least one shared edge of at least two adjacent sub-blocks are re-sized to form a modified contiguous area such that respective areas of respective sub-portions remain constant.

8. An integrated circuit comprising:
    a plurality of large block synthesis (LBS) blocks comprising respective pluralities of macros merged therein and including a first LBS block having a first area and a second LBS block having a second area, wherein respective LBS blocks comprise internal interconnects configured for communication within a respective LBS block and external interconnects configured for communication between respective LBS blocks;
    wherein the first LBS block and the second LBS block are overlapped to form an overlap area less than the first area and less than the second area; and
    wherein the overlap area is apportioned such that a first portion of the overlap area is utilized by the first LBS block and a second portion of the overlap area is utilized by the second LBS block, wherein the overlap area is apportioned according to an overlap configuration comprising a plurality of sub-blocks defining the overlap area, wherein the first portion comprises a first set of sub-blocks, or portions thereof, and wherein the second portion comprises a second set of sub-blocks, or portions thereof.

9. The integrated circuit of claim 8, wherein respective sub-blocks of the overlap configuration are further apportioned such that respective first sub-portions of respective sub-blocks of the plurality of sub-blocks are apportioned to the first LBS block and respective second sub-portions of respective sub-blocks of the plurality of sub-blocks are apportioned to the second LBS block; and
    wherein respective first sub-portions and respective second sub-portions are defined by a logic density function based on respective locations of respective sub-blocks within the overlap configuration.

10. The integrated circuit of claim 9, wherein respective first sub-portions range from 0% to 100%, inclusive, of respective sub-blocks, wherein respective second sub-portions range from 0% to 100%, inclusive, of respective sub-blocks, and wherein respective sums of respective first sub-portions and respective second sub-portions associated with a same respective sub-block equals 100%.

11. The integrated circuit of claim 9, wherein two or more respective sub-portions allocated to a same LBS block and located within two or more adjacent sub-blocks are aligned to form a contiguous area along one or more shared edges of the two or more adjacent sub-blocks.

12. The integrated circuit of claim 11, wherein the contiguous area comprises a rectangular geometry.

13. A computer program product comprising a computer readable storage medium having program instructions embodied therewith, wherein the computer readable storage medium is not a transitory signal per se, and wherein the program instructions are executable by a processor to cause the processor to perform a method comprising:
  selecting, based on an integrated circuit (IC) floorplan, a first LBS block and a second LBS block of a plurality of LBS blocks containing respective pluralities of merged macros therein, wherein the first LBS block comprises a first area, and wherein the second LBS block comprises a second area;
  overlapping a portion of the first LBS block with a portion of the second LBS block to form an overlap area, wherein the overlap area is less than the first area, and wherein the overlap area is less than the second area;
  allocating a first portion of the overlap area to the first LBS block and a second portion of the overlap area to the second LBS block, wherein allocating a respective portion to a respective LBS block dedicates resources of the respective portion to the respective LBS block;
  calculating a first utilization for the first portion and a second utilization for the second portion;
  comparing the first utilization to a target utilization and comparing the second utilization to the target utilization;
  in response to the first utilization being below the target utilization, re-apportioning the overlap area between the first LBS block and the second LBS block; and
  in response to the second utilization being below the target utilization, re-apportioning the overlap area between the first LBS block and the second LBS block; and
  manufacturing an integrated circuit based on the IC floorplan and comprising the re-apportioned overlap area.

14. The computer program product of claim 13, wherein the program instructions configured to allocate a first portion of the overlap area to the first LBS block and a second portion of the overlap area to the second LBS block are further configured to cause the processor to perform a method further comprising:
  defining the first portion and the second portion according to an overlap configuration that segments the overlap area into a plurality of sub-blocks, wherein the first portion comprises a first set of sub-blocks, or portions thereof, and wherein the second portion comprises a second set of sub-blocks, or portions thereof; and
  routing, according to the overlap configuration, a plurality of interconnects of the first LBS block, a plurality of interconnects of the second LBS block, and a plurality interconnects between the first LBS block and the second LBS block.

15. The computer program product of claim 14, wherein respective sub-blocks of the overlap configuration are further allocated such that respective first sub-portions of respective sub-blocks are apportioned to the first LBS block and respective second sub-portions of respective sub-blocks are apportioned to the second LBS block; and
  wherein respective first sub-portions range from 0% to 100%, inclusive, and respective second sub-portions range from 0% to 100%, inclusive, and respective sums of respective first sub-portions and respective second sub-portions associated with a same respective sub-block are less than 100%.

16. The computer program product of claim 15, wherein the program instructions configured to allocate a first portion of the overlap area to the first LBS block and a second portion of the overlap area to the second LBS block are further configured to cause the processor to perform a method further comprising:
  forming at least one contiguous area by placing two or more sub-portions of two or more adjacent sub-blocks allocated to a same LBS block along at least one shared edge of the two or more adjacent sub-blocks.

17. The computer program product of claim 16, wherein the program instructions configured to form at least one contiguous area are further configured to cause the processor to perform a method further comprising:
  forming at least one modified contiguous area by resizing the at least one contiguous area such that the at least one modified contiguous area comprises a rectangular geometry and further such that an area of the at least one modified contiguous area is equal to an area of the at least one contiguous area.

* * * * *